US00RE37391B1

(19) United States
(12) Reissued Patent
Nishi

(10) Patent Number: US RE37,391 E
(45) Date of Reissued Patent: Sep. 25, 2001

(54) EXPOSURE METHOD AND PROJECTION EXPOSURE APPARATUS

(75) Inventor: Kenji Nishi, Kawasaki (JP)

(73) Assignee: Nikon Corporation, Tokyo (JP)

(21) Appl. No.: 08/377,254

(22) Filed: Jan. 24, 1995

Related U.S. Patent Documents

Reissue of:
(64) Patent No.: 5,194,893
Issued: Mar. 16, 1993
Appl. No.: 07/845,065
Filed: Mar. 3, 1992

(30) Foreign Application Priority Data

Mar. 6, 1991 (JP) ..... 3-39874

(51) Int. Cl.[7] ..... G03B 27/42
(52) U.S. Cl. ..... 355/53; 355/55
(58) Field of Search ..... 355/53, 55, 71, 355/77; 356/358, 152, 125; 250/548

(56) References Cited

U.S. PATENT DOCUMENTS

| | | | | |
|---|---|---|---|---|
| 3,819,265 | | 6/1974 | Feldman et al. | 355/51 |
| 4,068,947 | * | 1/1978 | Buckley et al. | 355/72 |
| 4,420,233 | | 12/1983 | Nomoto et al. | 353/122 |
| 4,558,949 | * | 12/1985 | Uehara et al. | 356/152 |
| 4,585,337 | * | 4/1986 | Phillips | 355/53 X |
| 4,676,630 | | 6/1987 | Matsushita et al. | 355/53 |
| 4,705,940 | | 11/1987 | Kohno | 250/201 |
| 4,742,376 | * | 5/1988 | Phillips | 355/77 |
| 4,747,678 | * | 5/1988 | Shafer et al. | 350/505 |
| 4,748,478 | | 5/1988 | Suwa et al. | 355/53 |
| 4,770,531 | * | 9/1988 | Tanaka et al. | 356/358 |
| 4,864,360 | | 9/1989 | Isohata et al. | 355/53 |
| 4,869,998 | | 9/1989 | Eccles et al. | 430/311 |
| 4,869,999 | * | 9/1989 | Fukuda et al. | 430/311 |
| 4,878,086 | | 10/1989 | Isohata et al. | 355/77 |
| 4,902,900 | * | 2/1990 | Kamiya et al. | 250/548 |
| 4,924,257 | * | 5/1990 | Jain | 355/53 |
| 4,933,714 | | 6/1990 | Buckley et al. | 355/43 |
| 4,953,960 | | 9/1990 | Williamson | 350/442 |
| 4,962,318 | | 10/1990 | Nishi | 250/548 |
| 4,999,669 | | 3/1991 | Sakamoto et al. | 355/53 |
| 5,089,913 | | 2/1992 | Singh et al. | 359/727 |
| 5,150,152 | | 9/1992 | Isohata et al. | 355/53 |
| 5,160,957 | | 11/1992 | Ina et al. | 355/43 |
| 5,227,839 | | 7/1993 | Allen | 355/53 |
| 5,227,862 | | 7/1993 | Oshida et al. | 356/363 |
| 5,238,870 | | 8/1993 | Tanaka | 437/173 |
| 5,281,996 | * | 1/1994 | Bruning et al. | 355/53 X |

FOREIGN PATENT DOCUMENTS

| | | |
|---|---|---|
| A-61-251025 | 11/1986 | (JP) . |
| A-62-208629 | 9/1987 | (JP) . |
| A-63-12134 | 1/1988 | (JP) . |
| A-63-58930 | 3/1988 | (JP) . |
| 4-196513 | 7/1992 | (JP) . |

OTHER PUBLICATIONS

English–language translantion of JP–A–61–51025.
English–language translation of JP–A–63–12134.

(List continued on next page.)

*Primary Examiner*—Fred L. Braun
(74) *Attorney, Agent, or Firm*—Oliff & Berridge, PLC

(57) ABSTRACT

A projection exposure apparatus carries out scan exposure with illumination flux of slit(s) by moving a mask and a substrate in a direction of one-dimension at synchronized speeds with each other. The mask is inclined with a predetermined angle relative to the substrate in the direction of one-dimensional movement. The substrate is also moved in a direction of optical axis of projection optical system when moved in the direction of one-dimension, such that a central part of transfer area on the substrate is located on a best focal plane of projection optical system upon scan exposure.

13 Claims, 6 Drawing Sheets

OTHER PUBLICATIONS

Solid State Technology, May 1982, "Expanding the Horizons of Optical Projection Lithography", Jere D. Buckley, pp. 77–82.

Lin, "The Paths to Subhalf–Micrometer Optical Lithography", SPIE vol. 922 Optical/Laser Microlithography (1988), pp. 256–269.

Bruning, "Optical imaging for microfabrication", J. Vac Sci. Technol. 17(5), Sep./Oct. 1980, pp. 1147–1155.

Buckley, Jere D. et al, "Step and scan: A Systems overview of a new lithography tool", Optical/Laser Microlithography II, 1989, SPIE vol. 1088, pp. 424–433.*

* cited by examiner

EXPOSURE METHOD AND PROJECTION EXPOSURE APPARATUS

Matter enclosed in heavy brackets [ ] appears in the original patent but forms no part of this reissue specification; matter printed in italics indicates the additions made by reissue.

*This is one of five (5) reissue applications directed to various distinct and separate aspects of a projection exposure apparatus and method described in U.S. Pat. No. 5,194,893, which corresponds to U.S. application Ser. No. 07/845,065, filed Mar. 3, 1992. The first filed reissue application corresponds to application Ser. No. 08/377,254, filed Jan. 24, 1995. The other four reissue applications are divisional applications of application Ser. No. 08/377,254. The serial numbers and filing dates of the four divisional reissue applications are: 09/481,507 filed Apr. 12, 2000; 09/515,503 filed Apr. 12, 2000; 09/515,269 filed May 5, 2000; and 09/516,563 filed Jun. 15, 2000.*

BACKGROUND OF THE INVENTION

1. Field of the Invention

The present invention relates to an exposure method and a projection exposure apparatus used in a lithography process in production of semiconductor elements, liquid crystal elements, or the like.

2. Related Background Art

There are two fundamental exposure methods conventionally used in such projection exposure apparatus. In one method, a photosensitive substrate such as semiconductor wafer, glass plate, etc. is exposed to light in a step and repeat method through a projection optical system having an exposure field which can include the whole pattern of mask or reticle. The other is a scan method in which a reticle and a photosensitive substrate are opposed to each other at the both sides of a projection optical system under illumination light of arch slit illuminates the reticle, and the reticle and the photosensitive substrate are relatively scanned for exposure under the illumination. Steppers employing the former step and repeat exposure method are leading apparatus recently used in the lithography process. The step and repeat exposure method has been improved in resolution, overlay accuracy, throughput, and so on, and became superior in these respects to aligners employing the latter exposure method. Therefore, it is considered that such steppers employing the step and repeat exposure method will be leading in lithography for a while.

It is proposed for the step and repeat exposure method that the photosensitive substrate and a best imaging plane of projection optical system be relatively moved in a direction of optical axis during exposure of one shot area in order to increase an apparent depth of focus of the projection optical system. This exposure method will be hereinafter referred to as a successive focussing exposure method. In this successive focussing exposure method, the moving amount in the optical axis direction is determined considering a real depth of focus of projection optical system and micro unevenness on the photosensitive substrate. The best imaging plane of projection optical system is arranged to be located between the top and the bottom of the unevenness on the photosensitive substrate surface during the movement.

Meanwhile, a novel scan exposure method achieving high resolution has been recently proposed as a step and scan method on pp 424–433, SPIE vol. 1088, "Optical/Laser Microlithography II", 1989. The step and scan method uses both a scan method, in which a reticle is one-dimensionally scanned and a photosensitive substrate is also one-dimensionally scanned at a speed synchronized with the reticle speed, and a step method, in which the photosensitive substrate is stepped in a direction perpendicular to the scan exposure direction.

FIG. 11 is a drawing to illustrate a concept of the step and scan method. In FIG. 11, a shot area of one chip or multiple chips is scanned for exposure with illumination light RIL of arch slit in the X-direction on a photosensitive substrate or wafer W. The wafer is stepped in the Y-direction. In FIG. 11 a broken line shows a sequence of exposure of step and scan as will be hereinafter referred to as S and S, so that the S and S exposure is carried out on shot areas $SA_1$, $SA_2$, . . . , $SA_6$ in this order, and then on shot areas $SA_7$, $SA_8$, . . . , $SA_{12}$ arranged in the Y-direction in the center of the wafer. In the aligner of the S and S method as disclosed in the above-mentioned reference, an image of reticle pattern illuminated by the arch slit illumination light RIL is focussed on the wafer W through a one-quarter reduction projection optical system. Thus, a scan speed of reticle stage in the X-direction is controlled precisely to four times of that of wafer stage in the X-direction. The arch slit illumination light RIL is used because a demagnification system with a combination of refraction and reflection elements is employed as the projection optical system, and advantage is taken of various abberations being zero in a narrow annular region apart at a certain distance from the optical axis. An example of such reflection reduction projection system is disclosed in U.S. Pat. No. 4,747,678.

However, it is impossible that the successive focussing exposure method for the step and repeat method is applied to the step and scan method. In detail, the step and repeat method takes such a structure that the reticle/wafer and the illumination optical flux/exposure flux cannot be moved relative to each other in a direction perpendicular to the optical axis of the projection optical system, i.e., in a direction of wafer plane, upon exposure of one shot area. Therefore, a point of pattern in a transfer region on a reticle may be exposed at a plurality of focus points by relatively moving the wafer and the projection optical system in a direction of the optical axis upon exposure. In contrast, the step and scan method takes such a structure that the reticle/wafer and the illumination flux/exposure flux may be moved relative to each other in the direction perpendicular to the optical axis upon exposure of one shot area. In this structure, if the wafer and the projection optical system are moved relative to each other in the optical axis direction upon exposure, there would be mixed focussed parts and unfocused parts on the wafer depending on positions in the transfer region on the reticle. Accordingly, if the same successive focussing method as in the step and repeat method is used for the S and S method, an increase in a depth of focus could not be expected, but degrading the resolution of image on the contrary.

SUMMARY OF THE INVENTION

It is, therefore, an object of the present invention to provide an exposure method and a projection exposure apparatus, applying a successive focussing method to a scanning exposure method, to obtain an increase in a depth of focus.

The object of the present invention, solving the above-described problem, can be achieved by a method for exposure in which a pattern IR formed in a transfer region on a mask R is subject to projection exposure through a projection optical system PL to be led onto an area to be exposure, or shot area, on a photosensitive substrate W, and the mask and the photosensitive substrate are at least one-dimensionally, relatively scanned with respect to a projection field IF of the projection optical system PL: comprising, limiting a width of the area of pattern image projection on the photosensitive substrate W through the projection optical system PL to an approximately constant value in a direction of one-dimensional scan; and inclining a local surface on the photosensitive substrate W on which the pattern image is formed, relative to a best focal plane BF of the projection optical system PL in the direction of one-dimensional scan.

Also, the object of the present invention can be achieved by a projection exposure apparatus comprising: a projection optical system PL for projecting a pattern IR formed in a transfer region on a mask R, onto an area to be exposed, or shot area, on a photosensitive substrate W; a mask stage 14 for one-dimensionally moving the mask R over a region beyond a width of the transfer region in a direction of movement; a substrate stage 17, 18 for one-dimensionally moving the photosensitive substrate W in the direction of one-dimensional movement of the mask stage 14 at a speed synchronized with a movement speed of the mask stage 14; an illumination system 1–13 for illuminating the mask R with an illumination flux for exposure, having a shape between a rectangle and a slit within the projection field IF of the projection optical system PL and having an approximately constant width in the direction of one-dimensional movement; a substrate holder 16 for holding the photosensitive substrate W on the substrate stage 17, 18 with a predetermined inclination angle with respect to the direction of one-dimensional movement of illuminated area formed by the illumination flux on the photosensitive substrate through the mask R and the projection optical system PL; a holder drive system 21 for moving the substrate holder 16 in a direction of optical axis AX of the projection optical system such that a central part of the illuminated area on the photosensitive substrate W is located near a best focal plane of the projection optical system PL; and a control system 54 for controlling the holder drive system 21 to maintain an imaging condition of pattern image of the mask R on the photosensitive substrate W with correspondence to a position in the illuminated area in the direction of one-dimensional movement while scan exposure of pattern of the mask is effected on the area to be exposed.

According to the present invention, in a projection exposure apparatus of scanning exposure method, the substrate holder is arranged to hold the photosensitive substrate with the predetermined inclination to the one-dimensional scan direction of illumination area of illumination flux, so that the best focal plane of projection optical system and the illuminated area on the photosensitive substrate may be inclined relative to each other. Further, the holder drive means is provided in translate the substrate holder in the optical axis direction of projection optical system, such that the central part in the illuminated area on the photosensitive substrate is located at or near the best focal plane of the projection optical system. This arrangement allows continuous or discrete change of focussing of pattern image on the reticle for scan exposure. In other words, the depth of focus may be effectively increased.

DETAILED DESCRIPTION OF THE PREFERRED EMBODIMENTS

Figure 1:
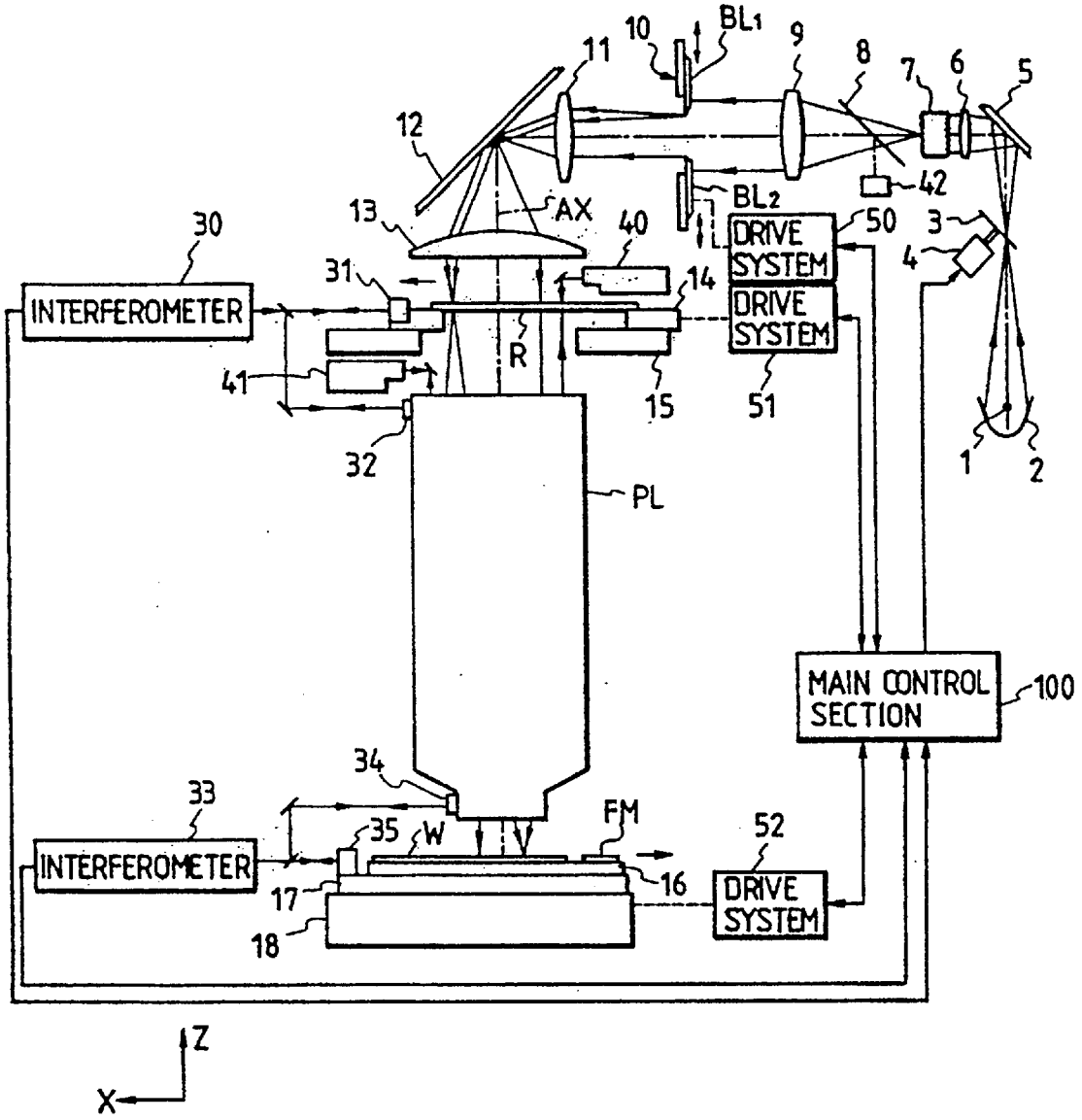
FIG. 1 is a drawing to show a structure of a preferred embodiment of a projection exposure apparatus according to the present invention.

FIG. 1 is a drawing to show a structure of a preferred embodiment of a projection exposure apparatus according to the present invention. In this embodiment, a projection optical system PL may be composed only of refraction elements or of a combination of refraction and reflection elements to be a one-fifth reduction system, as being double side telecentric.

Illumination light for exposure from a mercury vapor lamp 1 is condensed at a secondary focus point by an ellipsoidal mirror 2. A rotary shutter 3 is disposed at the secondary focus point to switch the illumination light between interception and transmission of light by a motor 4. The illumination light passed through the shutter 3 is reflected by a mirror 5, and enters an optical integrator or fly eye lens 7 through an input lens 6. There are numerous secondary light source images formed at the output side of the fly eye lens 7, and the illumination light from the secondary light source images is led through a beam splitter 8 into a lens system or condenser lens 9.

Figure 2:
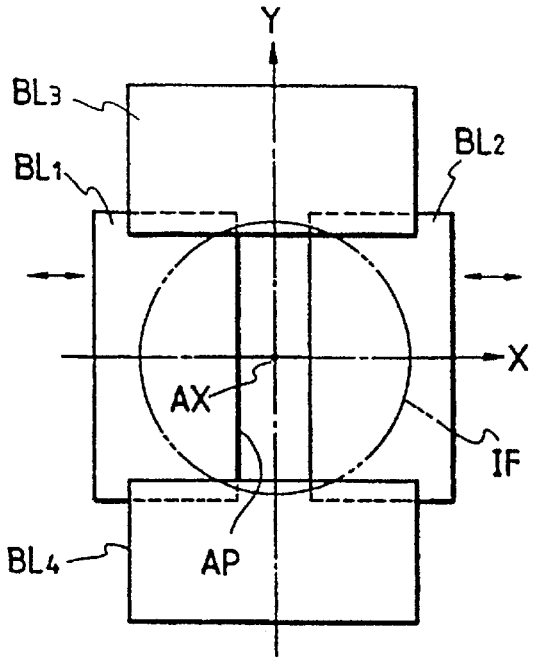
FIG. 2 is a drawing to show an arrangement of blades constituting a reticle blind.

Movable blades $BL_1$, $BL_2$, $BL_3$, $BL_4$ of a reticle blind mechanism 10 as shown in FIG. 2 are arranged on a back side focal plane of the lens system 9. The four blades $BL_1$, $BL_2$, $BL_3$, $BL_4$ are independently moved by a drive system 50. In this embodiment, edges of the blades $BL_1$, $BL_2$ define a width of aperture AP in the X-direction or scan exposure direction, and edges of blades $BL_3$, $BL_4$ a length of the aperture AP in the Y-direction or stepping direction. The aperture AP defined by the respective edges of four blades $BL_1$–$BL_4$ is included in a circular image field IF of the projection optical system PL.

The illumination light takes a uniform distribution of illumination at the position of the blind mechanism 10. The illumination light passed through the aperture AP of the blind mechanism 10 is guided through a lens system 11, a mirror 12, and a main condenser lens 13 to a reticle R to be illuminated. Then an image of the aperture AP defined by the four blades $BL_1$–$BL_4$ of the blind mechanism 10 is focussed on a pattern plane on a lower surface of the reticle R.

The reticle R receiving the illumination light defined by the aperture AP is held by a retircle stage 14, which is movable at a uniform rate at least in the X-direction on a column 15. The column 15 is incorporated with an unrepresented column holding a lens barrel of the projection optical system PL. The reticle stage 14 may be one-dimensionally moved in the X-direction and rotated by a small amount to correct its yawing by a drive system 51. A movable mirror 31 is fixed at an end of the reticle stage 14 to reflect a measurement beam from a laser interferometer 30, so that the laser interferometer 30 may measure a position of the reticle R in the X-direction and the amount of yawing in a real time manner. A fixed mirror or reference mirror 32 for the laser interferometer 30 is fixed at the upper end of the lens barrel of projection optical system PL.

An image of pattern formed in a transfer region, for example a rectangular region, of reticle R is imaged on a wafer W after reduced to one-fifth thereof by the projection optical system PL. The wafer W is held together with a reference mark plate FM by a wafer holder 16 which is rotatable by a small amount and inclinable at an arbitrary angle. The wafer holder 16 is disposed on a Z-stage, which is movable by a small amount in a direction of the optical axis AX or the Z-direction of the projection optical system PL. The Z-stage 17 is mounted on an X,Y-stage 18 which is two-dimensionally movable in the X- and the Y-directions in the step and repeat method, and the X,Y-stage 18 is driven by a drive system 52. Further, a laser interferometer 33 measures a coordinate position and a yawing amount of the X,Y-stage 18. A fixed mirror or reference mirror 34 for the laser interferometer 33 is fixed at the lower end of the lens barrel of the projection optical system, and a movable mirror 35 is fixed at one edge of the Z-stage 17. Since the projection magnification is one fifth in this embodiment, a moving velocity Vws of the X,Y-stage is set at one fifth of a velocity Vrs of the reticle stage in the X-direction 14 upon scan exposure.

Also in the present embodiment, there are provided an alignment system 40, which employs a TTR (Through-The-Reticle) method to detect an alignment mark or reference mark FM on the wafer W through the reticle R and the projection optical system PL, and an alignment system 41, which employs a TTL (Through-The-Lens) method to detect an alignment mark or reference mark on the wafer W through the projection optical system at a position below the reticle R. These alignment systems 40, 41 perform relative alignment of the reticle R and the wafer W before start of S and S exposure or during the scan exposure. If the reference mark FM is a light emitting type, a photoelectric sensor 42 as shown in FIG. 1 receives the light from the mark through the projection optical system PL, the reticle R, the condenser lens 13, the lens system 11, 9 and the beam splitter 8, whereby defining a position of the reticle R in the coordinate system of the X,Y-stage 18 or defining a position of detection center of the respective alignment systems 40, 41. It should be noted that these alignment systems are not always essential to the present invention.

As the length of the aperture AP of the blind mechanism 10 is made longer in the Y-direction perpendicular to the scan direction or X-direction, the number of scannings in the X-direction or the number of steppings in the Y-direction on the wafer W may be reduced. However, the length of the aperture AP in the Y-direction might better be changed by the edges of the blades $BL_3$, $BL_4$ depending on size, shape, and arrangement of chip pattern on the reticle R. A preferred example is that the facing edges of the blades $BL_3$, $BL_4$ coincide with street lines dividing the shot area on the wafer W. It is easy for this arrangement to adjust the length of aperture in correspondence with a size change in the Y-direction of shot area. If a length in the Y-direction of one shot area is over the maximum length of the aperture AP in the Y-direction, overlay exposure should be effected in the shot area to obtain seamless exposure as disclosed in U.S. Pat. No. 4,924,257. Since the method itself is not always essential to the present invention, detailed explanation thereof is omitted.

Figure 3A:
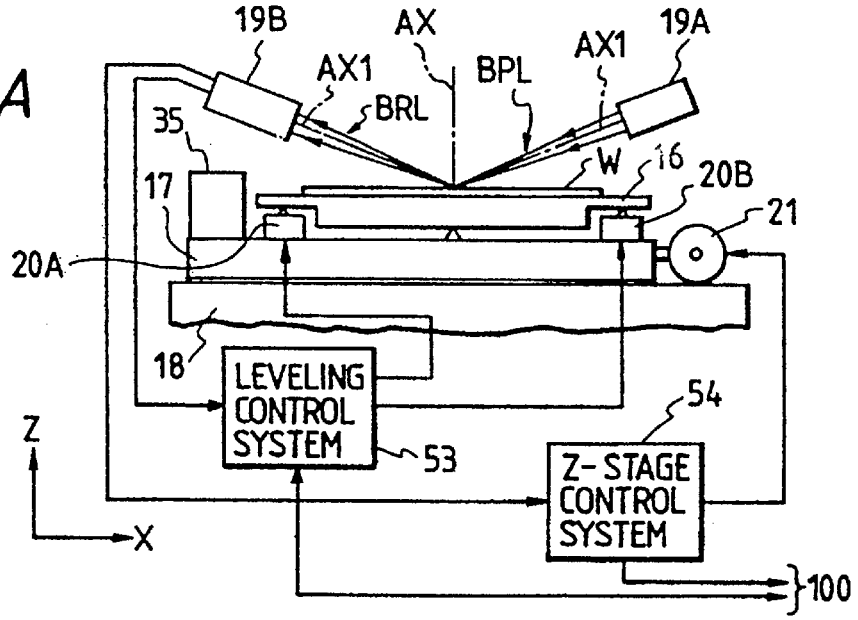
FIG. 3A is a drawing to show a schematic structure near a wafer holder.

Below explained with reference to FIG. 3A are the wafer holder 16 inclinable at an arbitrary angle, and neighbors thereof. A motor 21 is provided at the Z-stage 17, on the X,Y-stage 18 to drive the Z-stage 17 in the direction of the optical axis AX. The wafer holder 16 is mounted on the Z-stage 17 with its center being supported. Leveling drive sections 20A, 20B are provided at periphery of the wafer holder 16, so that the wafer W on the holder 16 may be inclined at an arbitrary angle. The leveling mechanism is disclosed for instance in U.S. Pat. No. 4,770,531, so detailed explanation of the leveling mechanism is omitted.

A focus and leveling sensor is provided to control the inclination angle of the wafer W, which is constructed by a light projector 19A emitting an optical flux BPL of a wave length different from that of the exposure light and a light receiver 19B receiving an optical flux BRL, which is the optical flux BPL reflected by the wafer surface. A focus point, of the optical flux BPL from the focus and leveling sensor is coincident with a line including a point through which the optical axis of the projection optical system PL passes on the wafer W. An example of the focus and leveling sensor is disclosed in U.S. Pat. No. 4,558,949. Thus detailed explanation is omitted.

The leveling drive sections 20A, 20B are driven by a command from a leveling control system 53 to determine an inclination amount of wafer holder 16, based on leveling information from the light receiver 19B and information from the main control section 100. With constant feed back of leveling information from the light receiver 19B, a proper inclination angle of the wafer W may be maintained. Further, focus information could be obtained to always locate an intersection with the optical axis AX on the wafer W on the best imaging plane of the projection optical system, with the information from the focus and leveling sensor. In this case, the motor 21 is driven by a command from the Z-stage control system 54 based on position information obtained by the light receiver 19B, to drive the Z-stage 17 in the direction of the optical axis AX.

Figure 3B:
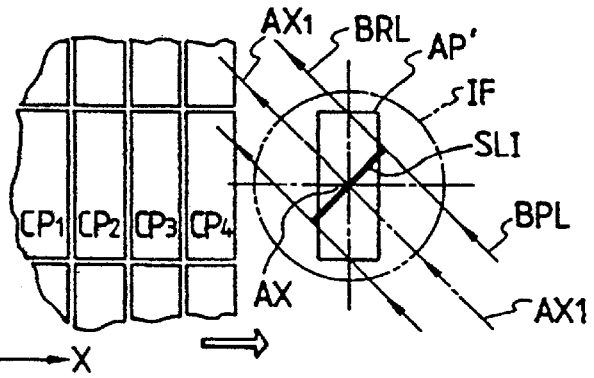
FIG. 3B is a drawing to show an illumination condition of illumination flow from a leveling sensor on a wafer.

The optical flux BPL is radiated on the wafer W as a slit light SLI inclined by 45° with respect to the rectangular illumination area AP' defined by the aperture AP of the blind as shown in FIG. 3B. By this, the position and the inclination of the wafer W in the Z-direction may be controlled without influence from the directionality of circuit pattern in the chip area $CP_1$–$CP_4$ already formed on the wafer W. Although there is shown only two points of the leveling drive section for explanation, it is no doubt that drive on three points is better.

In the focus and leveling sensor as disclosed in the above-mentioned U.S. Pat. No. 4,558,949, parallel optical fluxes occupying a determined ara are impinged on the wafer surface, and reflection optical flux from the wafer surface is photoelectrically detected, for example using a quartered photodetector, to detect the inclination or the leveling information of the wafer surface. Then, a variable field stop may be disposed inside the light projector 19A as disclosed for example in U.S. Pat. No. 4,902,900, to adjust the size and the shape of illumination area of parallel optical fluxes on the wafer surface, so that the size and the shape of the illumination area or detection area of the parallel optical fluxes on the wafer surface is desirably made almost coincident with the rectangular illumination area AP' defined by the aperture AP of the blind. By this, an average inclination of a local area in the shot region on the wafer W corresponding to the rectangular illumination area AP' may be effectively detected, the inclination amount of the wafer surface or wafer holder 16 may be controlled with a higher precision.

An operation of the preferred embodiment of the projection exposure apparatus will be below explained. The main control section 100 totally dominates the sequence and control of the operation as shown in FIG. 1. A fundamental operation of the main control section 100 is that, based on inputs of position information and yawing information from the laser interferometer 30, 33 and on inputs of speed information from a tachogenerator or the like in the drive systems 51, 52, reticle pattern and the wafer pattern in one shot area are relatively moved within a determined alignment error of the relative position while keeping a determined ratio of speed of the reticle stage 14 and the X,Y-stage 18 upon scan exposure. In addition to the fundamental operation, the main control section 100 of the present embodiment is characterized in that the best imaging plane or the best focal plane of the projection optical system PL (projection image plane of transfer region of the reticle) is inclined relative to the shot area on the wafer W, the central part of transfer region (corresponding to illumination area AP') on the shot area is always located at or near the best imaging plane or best focus position of the projection optical system PL, and thereby the focus condition of pattern image of reticle is continuously or discretely changed with correspondence to a position in the illumination area in the one-dimensional scan direction during the scan exposure, by controlling the leveling control system 53 and the Z-stage control system 54 together.

Figure 4A:
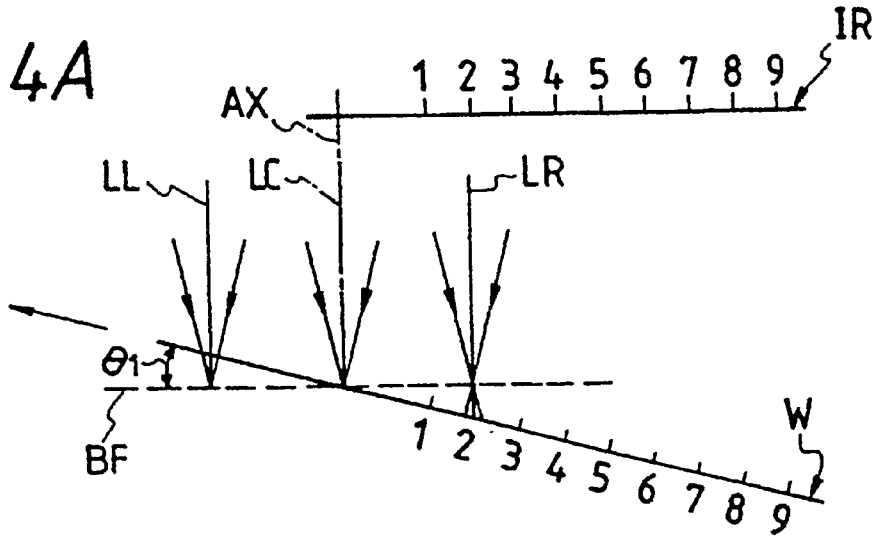
FIGS. 4A–4C are drawings to schematically show a method for exposure using the projection exposure apparatus of the preferred embodiment according to the present invention.
Figure 4B:
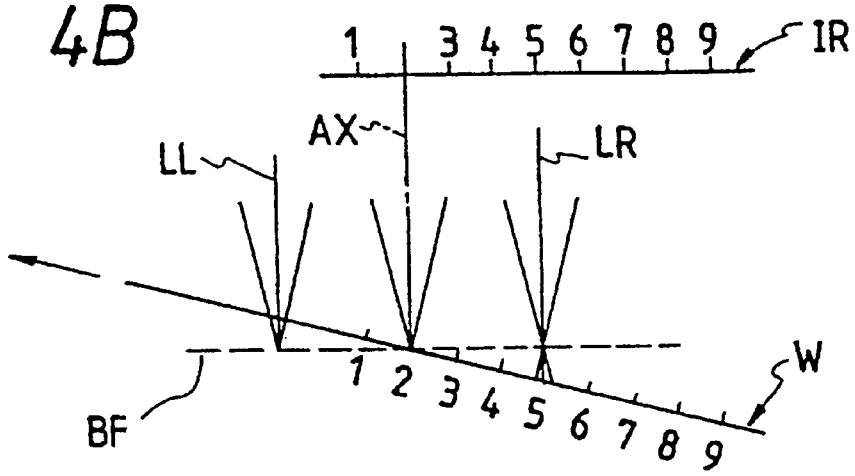
Figure 4C:
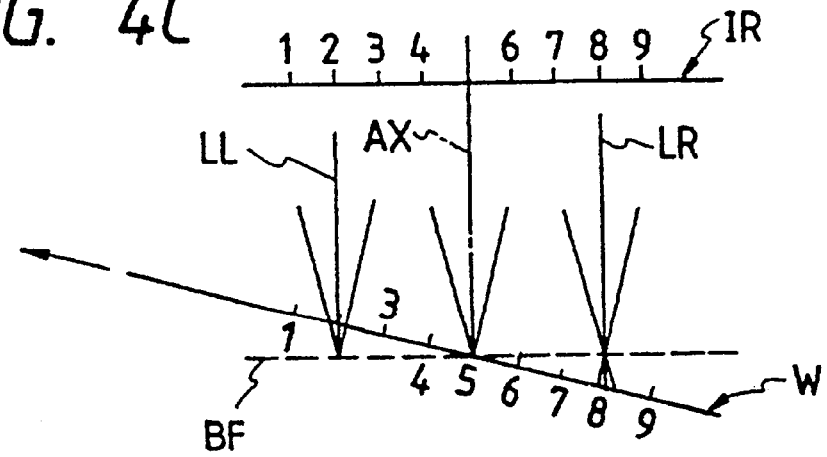

FIGS. 4A–4C schematically show a method for exposure using the projection exposure apparatus of the preferred embodiment according to the present invention. Positions 1–9 in a circuit pattern IR on the reticle R correspond to positions 1–9 on the wafer W, respectively. The wafer W is inclined relative to the pattern IR. The circuit pattern IR is displayed just above the wafer W, and a projection ratio of the circuit pattern IR is 1 on the wafer W for convenience of explanation. In the drawings, there are three optical fluxes LR, LC, LL shown out of the exposure flux defined by the single aperture AP. The optical fluxes LR, LL of the three are defined by the blades $BL_1$, $BL_2$ as shown in FIG. 2, and symmetrically arranged before and after the optical axis AX in the scan exposure direction. The width between the optical fluxes LR and LL corresponds to a width of the aperture AX in the X-direction, representing illumination range of exposure flux in the scanning direction. The intensity of exposure flux is uniform in this illumination range. The optical flux LC has a main light beam passing through the center of the illumination range of exposure flux. The main light beam corresponds to the optical axis AX of the projection optical system PL. The best imaging plane of the projection optical system PL is shown by a broken line BF.

The scan exposure is controlled such that the X,Y-stage 18 is driven in the X-direction and the Z-stage 17 is simultaneously driven in the direction of the optical axis AX, to always locate the approximate center in the illumination area of the wafer W (corresponding to the approximate center of illumination range of exposure flux) on the best imaging plane BF of the projection optical system PL. If the width of illumination area AP' on the wafer W is defined as $D_{ap}$, the inclination angle between the illumination area AP' on the wafer W and the best imaging plane BF as $\theta_1$, and a width in the optical axis of the depth of focus of the projection optical system PL (DOF) as $\Delta Z_f$, at least one of the depth $D_{ap}$ of the illumination area and inclination angle $\theta_1$ is adjusted to satisfy the following relation: $D_{ap} \cdot \sin \theta_1 \geqq \Delta Z_f$. A theoretical depth of focus is normally given by an equation $\theta Z_f = \lambda / NA^2$, where $\lambda$ is an exposure wave length, and NA is a numerical aperture of projection optical system.

A positional relation of wafer W and pattern IR to the exposure flux just after the scan exposure start is shown in FIG. 4A. Noting the position 2 in the circuit pattern IR, it is just entered within the illumination range of exposure flux. However, an image at the position 2 on the wafer W is in a condition of defocusing and the distribution of intensity of projection image has a gentle peak. FIG. 4B shows a condition after further scan exposure, in which the position 2 on the wafer W is located on the best imaging plane BF. In this condition, the image at the position 2 is in the best focus condition, presenting a steep peak in the intensity distribution of image. When the wafer is moved as shown in FIG. 4C, the position 2 is in the condition of defocussing opposite to the condition as shown in FIG. 4A, again showing a gentle peak in the intensity distribution of image.

Figure 5:
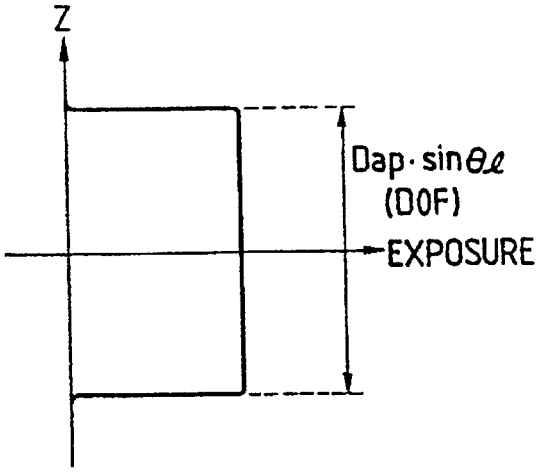
FIG. 5 is a drawing to show a distribution of exposure in a direction of the optical axis at an arbitrary position on a wafer by the scan exposure.
Figure 6A:
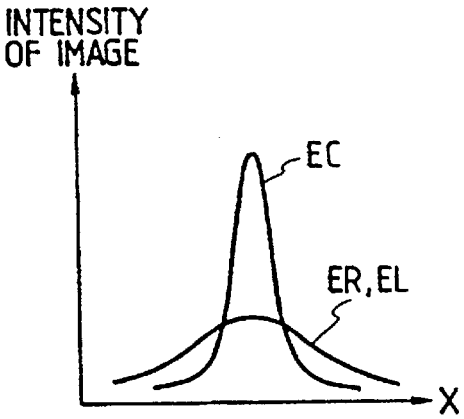
FIGS. 6A and 6B are drawings to show a distribution of intensity of image provided at an arbitrary position on the wafer when the scanning exposure is effected by the projection exposure apparatus of the preferred embodiment according to the present invention.
Figure 6B:
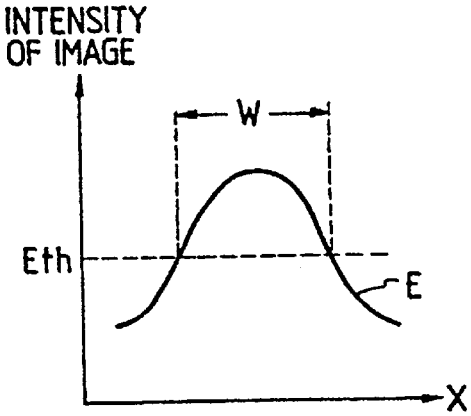

FIG. 5 shows a distribution of exposure amount in the direction of the optical axis AX or in the Z-direction at the position 2 on the wafer W by the above-described scan exposure or uniform rate scan. The exposure amount at the position 2 is uniform in the Z-directional range of $D_{ap} \cdot \sin \theta_1$ (the depth of focus DOF). FIGS. 6A and 6B show resultant distributions of intensity of image at the position 2. The intensity distributions ER, EC, EL in FIG. 6A represent intensities of images obtained from the optical fluxes LR, LC, LL, respectively. A distribution of intensity E as shown in FIG. 6B represents an integration of image intensity obtained from exposure flux of fluxes LR, LC, LL. Since the position 2 receives the optical fluxes (optical energy) while in the illumination range of exposure flux, the integrated intensity distribution E shows a gentle peak. As seen in FIG. 6B, a width in which the intensity is over an exposure amount $E_{th}$ enough to effect photosensitizing of photo resist on the wafer W, i.e., to completely remove the photo resist, becomes relatively broad, accordingly.

Figure 7:
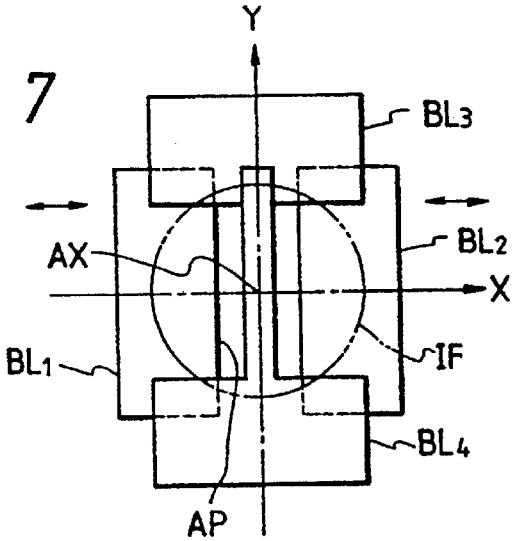
FIG. 7 is a drawing to show another example of blades constituting a reticle blind.
Figure 8:
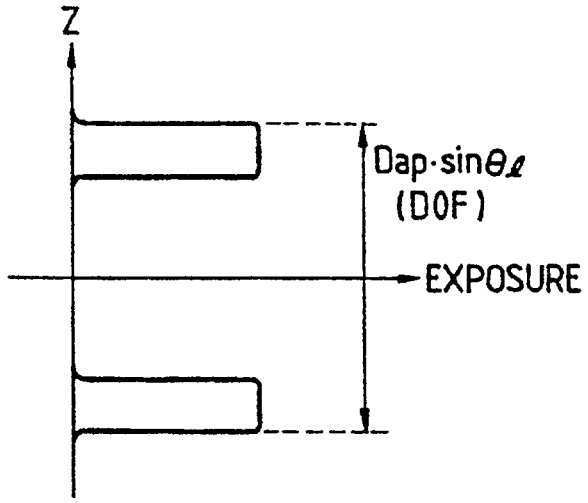
FIG. 8 is a drawing to show a distribution of exposure in the optical axis direction at an arbitrary position on the wafer by the scanning exposure.

In order to narrow the width W, there may be provided at least two peaks in the one-dimensional scan direction of scan exposure in the distribution of intensity of rectangular illumination flux. For example, as shown in FIG. 7, the reticle blind mechanism may be arranged to have such a structure that a central portion of the aperture AP is intercepted (double slit aperture). It may be achieved by providing the blade $BL_4$ of the four blades of the blind mechanism 10 with a Y-directionally extending interception branch to intercept light in a determined width in the X-direction at the center of the aperture AP. In case of use of such blind mechanism, the exposure amount in the direction of the optical axis AX or in the Z-direction is distributed as shown in FIG. 8 at the position 2 on the wafer W by the scan exposure or uniform rate scan. The exposure at the position 2 shows two identical intensity ranges located near the both ends of the Z-directional range of $D_{ap} \cdot \sin \theta_1$ (depth of focus DOF). By this arrangement, only the optical fluxes LR, LL in the exposure fluxes as shown in FIG. 4 possibly have intensities in the distribution.

Figure 9A:
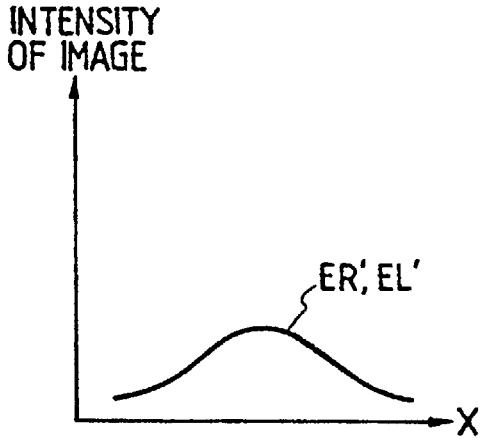
FIGS. 9A and 9B are drawings to show distributions of intensity of image given at an arbitrary position on the wafer when the scanning exposure effected by the projection exposure apparatus of another preferred embodiment according to present invention.
Figure 9B:
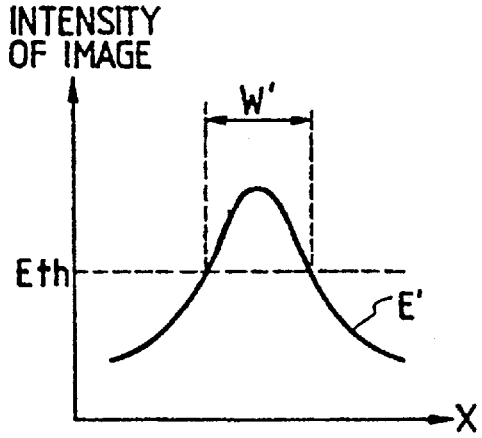

FIGS. 9A and 9B show distributions of intensity of image obtained at an arbitrary position, for example at the position 2 as above described, on the wafer W when the scan exposure of uniform rate scan is conducted by using such optical fluxes. The intensity distributions ER', EL' as shown in FIG. 9A are distributions of intensity of images given by the optical fluxes LR, LL, respectively. An intensity distribution E' as shown in FIG. 9B is an integration of the intensity distributions ER', EL'. The intensity distribution E' shows a steeper peak than that as shown in FIG. 6B. A width W' in which the intensity is over the exposure amount $E_{th}$ enough to effect photosensitizing of photo resist on the wafer W to completely remove it, is narrower than the width W as shown in FIG. 6B.

Figure 10:
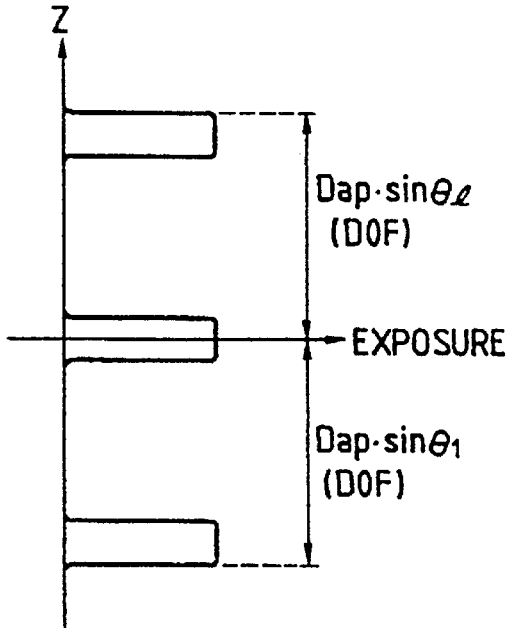
FIG. 10 is a drawing to show a distribution of exposure in the optical axis direction at an arbitrary position by the scanning exposure.
Figure 11:
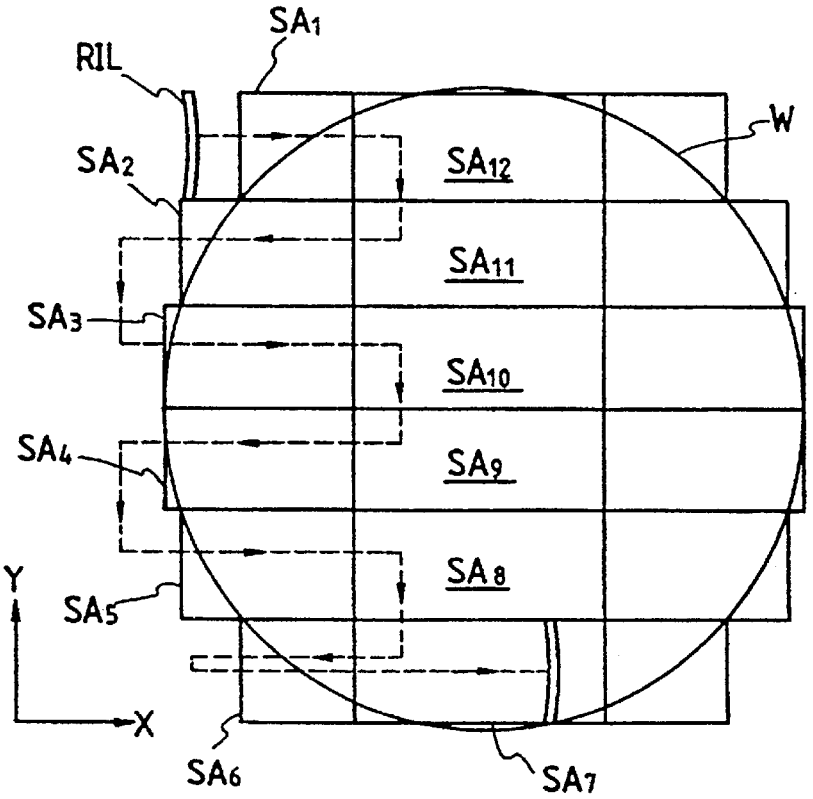
FIG. 11 PRIOR ART
FIG. 11 is a drawing to illustrate a concept of prior art step and scan exposure method.

Furthermore, three peaks may be employed in the one-dimensional scan direction of scan exposure in a distribution of intensity of rectangular illumination flux. For this purpose, a reticle blind mechanism is provided with blades with three slits in the aperture. FIG. 10 shows a distribution of exposure in the direction of optical axis AX at the position 2 on the wafer W by the similar scan exposure. At the position 2, three regions in the Z-direction have almost identical intensities of exposure, one near the best imaging plane BP, and two near the both ends of the Z-directional range of $D_{ap} \cdot \sin \theta_1$ (depth of focus DOF). Therefore, exposure flux reaching the wafer W includes fluxes corresponding to the optical fluxes LR, LC, LL, as shown in FIGS. 4A–4C. The optical fluxes LR, LL are symmetrical with respect to the optical flux LC having the same optical axis AX of the projection optical system. In case of scan exposure with the flux with three peaks in the distribution of intensity in the illumination range, a distribution of intensity of image projected onto the wafer W shows a steeper peak than the distribution of intensity E as shown in FIG. 6B. A width of projected image will be narrower than the width W as shown in FIG. 6B, accordingly.

Comparing two slits and three slits in the one-dimensional direction of scan exposure in the intensity distribution of rectangular illumination flux if the optical intensity of illumination flux is almost identical, exposure with three slits allows faster moving speed of the X,Y-stage and gives a higher throughput. This is opposite to the successive focussing exposure method conventionally known in U.S. Pat. No. 4,869,999.

In the above examples, the blades of the blind mechanism have a light intercepting portion. In another arrangement, the same effect may be obtained by an interception member such as ND filter having dimensions and shape corresponding to a region to be intercepted at a position conjugate to the circuit pattern IR in the optical path. Furthermore, although the wafer surface is inclined before the scan exposure in the above examples, the inclination of the wafer holder 16 may be controlled together with the Z-directional position of the wafer surface by using detection information of the focus and leveling sensor at the time of scan exposure start.

What is claimed is:

1. A method for exposure in which a pattern formed in a transfer region on a mask is subject to projection exposure through a projection optical system to be led onto an area to be exposed on a photosensitive substrate, and said mask and photosensitive substrate are at least one-dimensionally, relatively scanned with respect to a projection field of said projection optical system: comprising, limiting a width of said area of pattern image projected on said photosensitive substrate through the projection optical system to an approximately constant value in a direction of one-dimensional scan; and inclining a local surface on said photosensitive substrate on which said pattern image is formed, relative to a best focal plane of said projection optical system in the direction of one-dimensional scan.

2. A method for exposure according to claim 1, wherein a central part of said local surface in the direction of one-dimensional scan on said photosensitive substrate, on which said pattern image is formed, substantially coincides with said best focal plane of projection optical system when scanned for exposure.

3. A method for exposure according to claim 1, wherein, defining a width of local surface on the photosensitive substrate in the direction of one-dimensional scan, on which said pattern image is formed as $D_{ap}$, an angle of inclination between said local surface and said best focal plane as $\theta_1$, and a depth of focus of said projection optical system in a direction of optical axis as $\Delta Z_f$, the following relation is satisfied by adjusting at least one of said width $D_{ap}$ of the pattern image area and said inclination angle $\theta_1$;

$$D_{ap} \cdot \sin \theta_1 \geqq Z_f$$

4. A method for exposure according to claim 1, wherein, the order to limit said width of pattern image area in the direction of one-dimensional scan, a shape of illumination flux for exposure is made rectangular on said mask to be illuminated thereby, and an intensity distribution of said rectangular illumination flux has at least two peaks in the direction of one-dimensional scan.

5. A projection exposure apparatus comprising:

a projection optical system for projecting a pattern formed in a transfer region on a mask, onto an area to be exposed on a photosensitive substrate;

a mask stage for one-dimensionally moving said mask over a region beyond a width of said transfer region in a direction of movement;

a substrate stage for one-dimensionally moving said photosensitive substrate in the direction of one-dimensional movement of said mask stage at a speed synchronized with a movement speed of said mask stage;

illumination means for illuminating said mask with an illumination flux for exposure, having a shape between a rectangle and a slit within the projection field of said projection optical system and having an approximately constant width in the direction of one-dimensional movement;

a substrate holder the holding said photosensitive substrate on said substrate stage with a predetermined inclination angle with respect to the direction of one-dimensional movement of illuminated area formed by said illumination flux on said photosensitive substrate through said mask and said projection optical system;

holder drive means for moving said substrate holder in a direction of optical axis of said projection optical system such that a central part of said illuminated area on said photosensitive substrate is located near a best focal plane of said projection optical system; and control means for controlling said holder drive means to maintain an imaging condition of pattern image of said mask on said photosensitive substrate with correspondence to a position in said illuminated area in the direction of one-dimensional movement while scan exposure of pattern of said mask is effected on said area to be exposed.

*6. A scanning exposure apparatus for exposing a shot area defined by street lines on a sensitive surface of a substrate with an image of a pattern of a mask, said apparatus comprising:*

*a projection lens having a circular image field to project an image of the pattern of the mask onto the shot area of the substrate;*

*a scanning mechanism for one-dimensionally, relatively scanning the mask and substrate with respect to the circular image field of said projection lens at a predetermined velocity ratio corresponding to a magnification of said projection lens in order to perform scanning exposure of said shot area;*

*an illumination system for irradiating the mask with radiation having a rectangular distribution which is elongated in a cross-direction of said one-dimensional scan direction and is arranged at a center of a circular object field of said projection lens; and*

*an adjusting mechanism for adjusting the length of the rectangular distribution of said radiation in accordance with positions of said street lines.*

*7. A scanning exposure apparatus for exposing an image of a pattern of a mask onto a shot area defined on a sensitive substrate, said apparatus comprising:*

*a double telecentric reduction optical system having a circular image field and being composed only of refraction elements or of a combination of refraction and reflection elements, to project an image of the pattern of the mask onto the shot area of the substrate;*

*a scanning mechanism for one-dimensionally, relatively scanning the mask and substrate with respect to the circular image field of said reduction optical system at a predetermined velocity ratio corresponding to a magnification of said reduction optical system;*

*an illumination optical system for irradiating the mask with radiation having a rectangular distribution which is elongated perpendicularly to said one-dimensional scan direction and is arranged at a center of a circular object field of said reduction optical system, during the operation of said scanning mechanism; and*

*a variable aperture mechanism for adjusting the length of the rectangular distribution of said radiation in accordance with the size of said shot area;*

*wherein different portions of said shot area are successively scanned by rectangular pattern image portions of the mask.*

*8. A scanning exposure apparatus for exposing a predetermined region of a sensitive surface of a plate with an image of a pattern of a mask, said apparatus comprising:*

*(a) a double telecentric projection lens for projecting an image of the pattern of the mask onto the region of the plate;*

*(b) a scanning mechanism for one-dimensionally, relatively scanning the mask and plate with respect to a circular image field of said projection lens at a predetermined velocity ratio in order to perform scanning exposure of the region of said plate;*

*(c) an illumination system for irradiating the mask with radiation having a rectangular shape which is elongated in a cross-direction of the one-dimensional scanning direction and is arranged at the center of a circular object field of said projection lens, whereby a rectangular image portion of the mask pattern is projected toward the plate through said projection lens; and*

*(d) a focus condition detector for detecting a focus deviation of the surface of said plate relative to a best imaging plane of said projection lens within an area corresponding to said rectangular image portion, during the scanning of said scanning mechanism.*

*9. An apparatus according to claim 8, wherein said illuminating system includes an adjusting mechanism for adjusting the length of said rectangular shape according to the size of said region on said plate.*

*10. A scanning exposure method in which an image of a pattern of a mask is projected onto a shot area of a photosensitive plate through a projection system, and the mask and plate are at least one-dimensionally, relatively scanned with respect to a field of said projection system, the method comprising the steps of:*

*(a) providing a telecentric projection system having a circular image field which is smaller than said shot area and an optical axis which passes through the center of said circular image field;*

*(b) limiting an effective imaging area in said circular image field to a diametrically extending rectangular region having a predetermined width in said one-dimensional scan direction and having a predetermined length in a cross-direction of said one-dimensional scan direction,*

*wherein the middle of said width is arranged substantially at the center of said circular image field and said length is adjusted substantially in coincidence with a size of said shot area along said cross-direction; and*

*(c) scanning the mask and the plate relative to said rectangular effective image area in the one-dimensional scan direction with a predetermined velocity ratio in order to successively expose different portions of said shot area with rectangular pattern image portions of the mask.*

*11. A method for scanning exposure in which a pattern region of a mask is projected onto a shot area of a photosensitive plate through a projection system, and the mask and plate are at least one-dimensionally, relatively scanned with respect to a field of said projection system, the method comprising the steps of:*

*(a) providing a double telecentric projection lens having a circular image field which is smaller than said shot area and an optical axis which passes through the center of said circular image field;*

*(b) limiting an effective imaging area in the circular image field to an approximately rectangular shape having a predetermined width in the one-dimensional scan direction and having a predetermined length in a crossing direction of the one dimensional scan direction,*

*wherein the middle of said width is arranged substantially at the center of said circular image field;*

*(c) scanning the mask and plate relative to said rectangular effective imaging area in the one-dimensional scan direction with a predetermined velocity ratio in order to expose said shot area with an image of the pattern region of the mask;*

*(d) optically detecting a position of a surface portion of said plate, corresponding to said rectangular effective imaging area on the plate, along said optical axis during said scanning; and*

(*e*) *correcting focusing error between said surface portion of the plate and a best imaging plane of said projection lens in response to said position detecting during said scanning.*

*12. A method according to claim 11, wherein said limiting of the effective imaging area is performed by controlling a distribution shape of radiation irradiating the mask.*

*13. A method for scanning exposure in which a pattern region of a mask is projected onto a shot area of a photosensitive plate through a projection system, and the mask and plate are at least one-dimensionally, relatively scanned with respect to a field of said projection system, the method comprising the steps of:*

(*a*) *providing a reduction imaging lens having a circular image field which is smaller than said shot area and an optical axis which passes through the center of said circular image field;*

(*b*) *limiting a shape of an effective imaging area in the circular image field to a diametrically extending rectangular region having a predetermined width in the one-dimensional scan direction and having a predetermined length in a cross-direction of the one-dimensional scan direction, wherein the middle of said width is arranged substantially at the center of said circular image field and said length is adjusted substantially in coincidence with a size of said shot area along said cross-direction;*

(*c*) *scanning the mask and plate relative to said rectangular effective imaging area in the one-dimensional scan direction with a predetermined velocity ratio in order to expose said shot area with an image of the pattern region of the mask;*

(*d*) *optically detecting a focusing deviation and a leveling deviation of a surface portion of the plate corresponding to said rectangular effective imaging area on the plate, during said scanning; and*

(*e*) *adjusting focusing and leveling conditions between said surface portion of the plate and a best imaging plane of said reduction imaging lens in response to said focusing and leveling deviations, respectively, during said scanning.*

* * * * *